United States Patent
Keirn et al.

(10) Patent No.: US 6,177,890 B1
(45) Date of Patent: Jan. 23, 2001

(54) TECHNIQUE FOR INCREASING INFORMATION DENSITY IN DATA STORAGE DEVICES BY UTILIZING A HIGH-EFFICIENCY ENCODING SCHEME

(75) Inventors: Zak Keirn, Loveland; Daniel Woods, Longmont, both of CO (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/205,401

(22) Filed: Dec. 4, 1998

(51) Int. Cl.[7] .................................................. H03M 7/46
(52) U.S. Cl. ............................................................ 341/59
(58) Field of Search ................................................ 341/59

(56) References Cited

U.S. PATENT DOCUMENTS

| | | | |
|---|---|---|---|
| 5,969,649 | * 10/1999 | Ashley et al. | ............ 341/59 |
| 6,002,718 | * 12/1999 | Roth | .................... 375/240 |
| 6,035,435 | * 3/2000 | Shih et al. | ............ 714/795 |
| 6,046,691 | * 4/2000 | Aziz et al. | ............ 341/58 |

\* cited by examiner

*Primary Examiner*—Brian Young
(74) *Attorney, Agent, or Firm*—W. Daniel Swayze, Jr.; Wade James Brady, III; Frederick J. Telecky, Jr.

(57) ABSTRACT

An encoding scheme to translate user information into encoded information, including the steps of receiving the user information and translating the user information into encoded information by employing a new kind of Run Length Limited encoding scheme. The user information and the encoded information have the same cell size.

14 Claims, 3 Drawing Sheets

TECHNIQUE FOR INCREASING INFORMATION DENSITY IN DATA STORAGE DEVICES BY UTILIZING A HIGH-EFFICIENCY ENCODING SCHEME

FIELD OF THE INVENTION

The present invention is directed to data channel devices and more particularly to increasing the data density.

BACKGROUND OF THE INVENTION

Disk drives are commonly used in workstations, personal computers, laptops and other computer systems to store large amounts of data in a form that can be made readily available to the user. In general, the disk drive includes a magnetic disk that is rotated by a spindle motor. The surface of the disk is divided into a series of data tracks. The data tracks are spaced radially from one another across a band having an inner diameter and an outer diameter. Each of the data tracks extends generally circumferentially around the disk and can store data in the form of magnetic transitions within the radial extent of the track on the A disk surface. Typically, each data track is divided into a number of data sectors that can store fixed sized data blocks.

A head includes an interactive element, such a magnetic transducer, that is used to sense the magnetic transitions to read data or used to conduct an electronic signal that causes a transducer to write data to the data surface.

The magnetic transducer positioned with the active elements of this transducer as a position suitable for interaction with the magnetic transitions on the surface of the disk as the disk rotates. This positioning is performed with an actuator arm.

Typically, the head transmits the magnetic transitions in the form of the electrical signal to a preamplifier which in turn amplifies the signal and transmits the signal to a read channel. These read channels typically include a Phase Locked Loop (PLL) and an Automatic Gain Control (AGC) circuit. These types of systems require Run Length Limited (RLL) encoding. The RLL code does not allow sequences of data that can cause the PLL/AGC to lose a timing lock. A RLL code enforces a limit on the number of consecutive ones (111) and/or zeros (000) allowed to occur in the stream of data. Additionally, these RLL codes (or modulation codes) may also be used to prevent other problems from occurring that arise because of a particular head/media combination. For example, some tape drive products require dc free codes. The term RLL is used to broadly define any transformation of the original data into a form that the storage system can utilize effectively. The efficiency of the RLL code is measured in terms of a code rate. For every user byte/word of data (m bits), an encoded word (n bits) is written to the storage media. In all RLL codes, n>m and the code rate is equal to m/n. Code rates in the current storage products range from ½ to $16/17$. The most efficient code rate used in storage products today is $16/17$ that is 94.12% efficient. This efficiency is insufficient for future storage product needs and consequently a more efficient system is required.

Typically, one use of the RLL encoding is to prevent long sequences (runs) of zeros or ones from occurring in the data written to the storage media. The long sequences are removed by first utilizing a code word of length greater than the data word (n>m), then carefully choosing a subset from the n bit words so that the RLL requirements are met. These requirements are known as (d,k) constraints. The d constraint indicates how closely transitions (ones in NRZI) are allowed to be spaced. The k constraint indicates how far apart transitions can be spaced (zeros in NRZI). In PRML devices, there is an additional constraint (k1) on the number of transitions (ones in NRZI) allowed to occur in a row. There are theoretical limits on the code rate achievable with these schemes which is a function of the RLL constraints (d,k) and k1.

When user data (for this discussion, user data can be considered random data) are written without RLL encoding, the occurrence of long runs of zeros or ones is rare. Therefore, the RLL codes introduce inefficiency when applied to random data sequences. If the user data is not random, for instance a fixed pattern of zeros, then the RLL code is required. In many storage systems today, a data scrambler is employed to eliminate these fixed pattern effects. The scrambler effectively randomizes the data. If the user data is only encoded or altered when there is a need to enforce an RLL constraint, then the effective code rate or system efficiency may be greatly increased.

FIG. 7 illustrates both user bits and channel bits. The read channel encodes user bits into encoded bits. This usually involves some overhead because, as shown, with a ⅔ rate RLL two user bits are translated into three encoded bits during the same time period. The encoded channel bit has a shorter duration than the user bits. The size of each encoded channel bit or cell is reduced to accommodate the additional channel bits. It is desirable to maintain the cell size of the channel bit to that of the user bits.

SUMMARY OF INVENTION

The present invention provides a high-efficiency encoding scheme such that if user data does not need to be encoded or altered to enforce RLL constraints, then, the user data is written to the storage media without change. This would be an example of 100% efficiency in terms of code rate. If the user data contains runs of zeros or runs of ones that violate RLL constraints, then only those user bytes containing the violation are altered. In order to correct or detect this information, additional information to instruct the controller as to the location of the altered user bytes must be stored on the disk. This additional information is defined here as locator words. Correspondingly, if the data block includes a large number of violations then there would be correspondingly a large number of locator words written. With more locator words written, the system efficiency or the effective code rate is reduced. Typically, as a result of the nature of random data, the overall efficiency is generally very high and much higher than the code rate of today's channels.

Additionally, the present invention enforces RLL constraints without changing the cell size of the channel bits with respect to the cell size of the user bits. The present invention encodes the user bits during long run lengths, but the size of the cell remains unchanged.

DETAILED DESCRIPTION OF THE INVENTION

Figure 2:
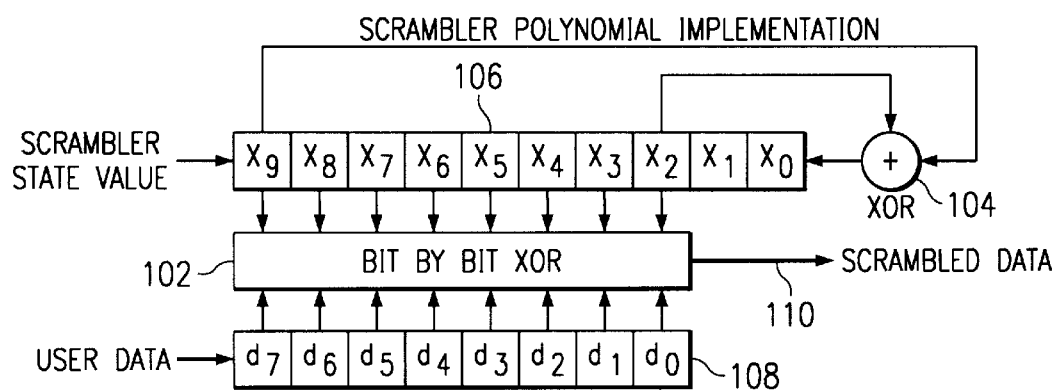
FIG. 2 illustrates a data scrambler block.

FIG. 2 illustrates a data scrambler as a hardware block that scrambles the incoming data stream by XORing the data with a pseudo-random polynomial number generator. The user data is stored in register 108 and the pseudo random polynomial is stored in register 106. In XOR register 104, the third bit ($x_2$ is XOR with the $10^{th}$ bit $x_9$). The results of this XOR operation is inserted to the first bit $x_0$. The polynomial is selected so that the polynomial is repeated at a length greater than a data block or sector. The register 102 is a shift register so that data is moved along the shift register one by one. The scrambler polynomial section may be clocked 8 times for each data byte.

The polynomial represents a recursion relationship to generate the pseudo-random sequence. In the example illustrated in FIG. 2, the polynomial is $1+x^3+x^{10}$. The order of the polynomial determines the length of the sequence generated. Correspondingly, after the length has been reached, the sequence repeats. Other polynomials may be used with the present invention for the scrambler block.

A random number seed determines where to start the pseudo-random sequence. Since, the pseudo-random sequence repeats, a way of changing the effect of the scrambler is to start the number sequence at a different location. Thus, by changing the seed in register 106, the effect of the scrambler is changed. Thus, a seed that can be changed each time a new data block is written is illustrated in FIG. 2. The seed would be the starting state value of X vector bits 9 to 0.

The locator word is a data word that is written to disk along with the user data. The locator word instructs the controller where the user bytes that were altered to enforce RLL constraints are located so the user bytes can be changed back to their original values when read. For example, if the user bytes were all ones or all zeros originally, and subsequently changed to enforce the RLL constraints before written to the disk, on readback, the modified user bytes have to be changed back to their original data values.

Figure 3:
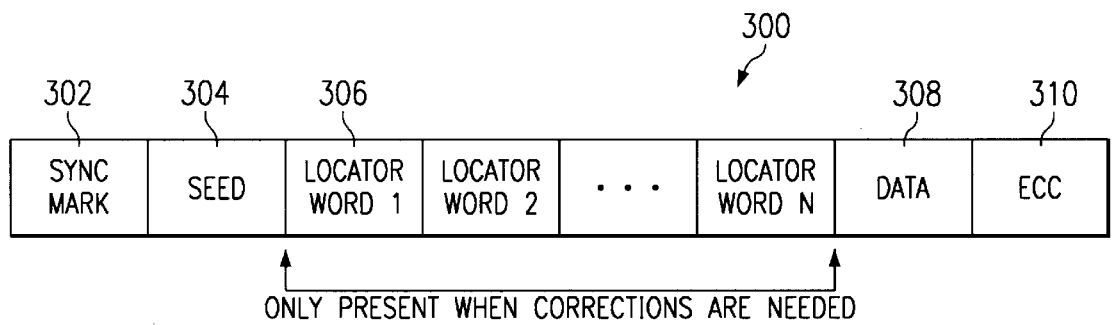
FIG. 3 illustrates a data format of variable rate encoding scheme.

FIG. 3 illustrates a possible data format of a high-efficiency encoding scheme. The data format is shown as it would be written on the storage media. The sync mark 302 indicates the beginning of the formatted data field 301. Next, the seed 304 is written adjacent to the sync mark 302. The seed value is required to be written to the disk since a different seed value is used each time the user data is written. Changing the seed value 304 each time helps to insure that the user will be provided protection against a pattern which could exactly match it. The controller reads the seed value 304 and uses the seed value 304 in the de-scrambler so that the data is properly decoded. Adjacent to the seed value 304 is locator word or words 306. These locator words indicate where user bytes are located that need to be changed back to their original value on readback. Data 308 is the user data written to the disk after altering any bytes, if needed, to meet RLL constraints. The error correction code 310 provides an indication of any errors.

The present invention generally would require the controller or channel to buffer some amount of user data. The actual amount of buffer space needed would vary. The buffer is used as a search area to search through the scrambled data for RLL violations. When the RLL violations are found, the user bytes are changed, and the locations of the RLL violations are stored.

Figure 4:
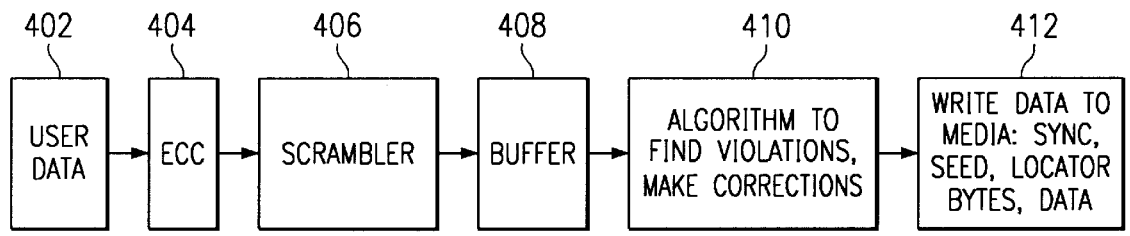
FIG. 4 illustrates a write data path flow.

The steps to write data are illustrated in FIG. 4. In FIG. 4, the user data 402 is passed to error correction code 404, and an error correction field is generated. The data plus ECC field is then scrambled by the scrambler block 406 and sent to the buffer. The buffer 408 is searched to find out all RLL violations. The algorithm 410 replaces violated byte(s) with altered byte(s) such that the result has no RLL violations and records locations of all the altered byte(s). The algorithm 410 generates all necessary locator bytes to be written to the media. The data with the corrected bytes and locator words and seed are written to the media.

Figure 5:
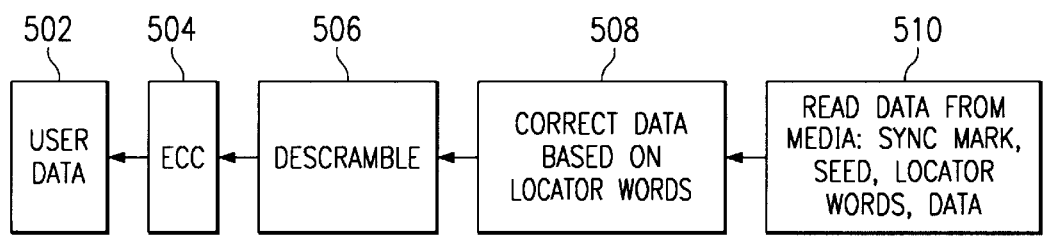
FIG. 5 illustrates a read data path flow.

FIG. 5 illustrates a readback data flow path. FIG. 5 illustrates that the written data is read from the disk 510 and the controller uses the sync mark to determine whether locator words are to be read or not. Next, the seed is read and used by the controller for descramble operation 506. The readback of the sync mark seed locator word and data are illustrated in block 510. In block 508, the controller uses the locator word information to change the proper bytes of the user data back to their original values. In block 506, the user data is descrambled and transmitted to the error correction control 504 (ECC). In block 504, the data passes to the error correction block, and in block 502, the user data is received.

Figure 6:
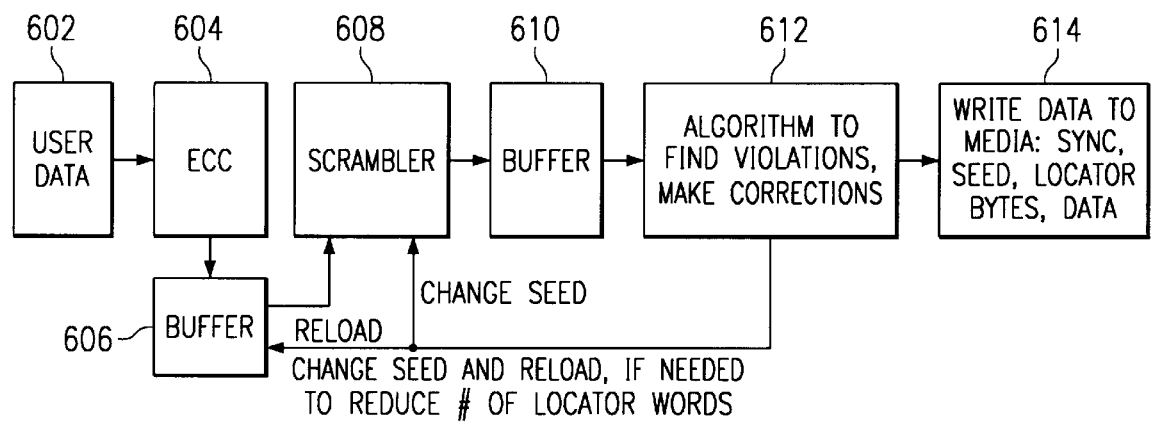
FIG. 6 illustrates a alternative write path to provide extra protection against fixed patterns.
Figure 7:
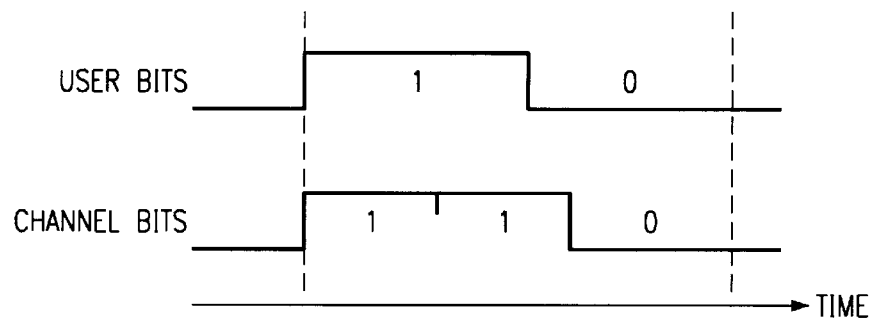
FIG. 7 illustrates a bit pattern.

The write path illustrated in FIG. 6 insures that it is not possible to match the polynomial and seed exactly. The data in block 612 is checked, and if there are too many locator bytes, determined by some threshold value, then a different seed would be tried and the data checked again. Thus if there are too many violations, the scrambler in block 608 changes the seed for this scrambler in block 608. The buffer in step 606 is reloaded. The buffer then transmits the information to the scrambler in step 608. This process is repeated until an acceptable number of locator words is determined based on the threshold value. The system latency and the buffer capacity used in step 606 and 610 would have to be increased. Note in contrast FIG. 4 has the seed only being changed once. FIGS. 4–6 show the ECC block as either the first operation in the write path or the last operation in the read path. One alternative would be to move the ECC block to be located immediately prior to writing data so that the locator words could additionally be ECC encoded/decoded.

The specific implementation of the locator words are important part of the present invention. While it is recognized that there are many different ways to implement the locator words, one simple way is to use a 9-bit locator word for each byte that needs to be changed. Since 9 bits is sufficient to represent any number between 0 and 511, 9 bits is sufficient to cover all positions in the sector (assuming a 512 byte sector). With larger sector sizes, a larger number of bits would correspondingly be needed. Additionally, the locator word could be larger to include information about more than one byte that needs to be corrected for RLL violations. For example, a locator word of 14 bits in length could use the first 6 bits to break up the locations in the sector to multiples of 8 bytes. Six (6) bits provides 64 byte locations. The next 8 bits could be used to tell which bytes following the 6-bit location need to be changed. Longer locator words could be used to split the sector up even further.

Figure 1A:
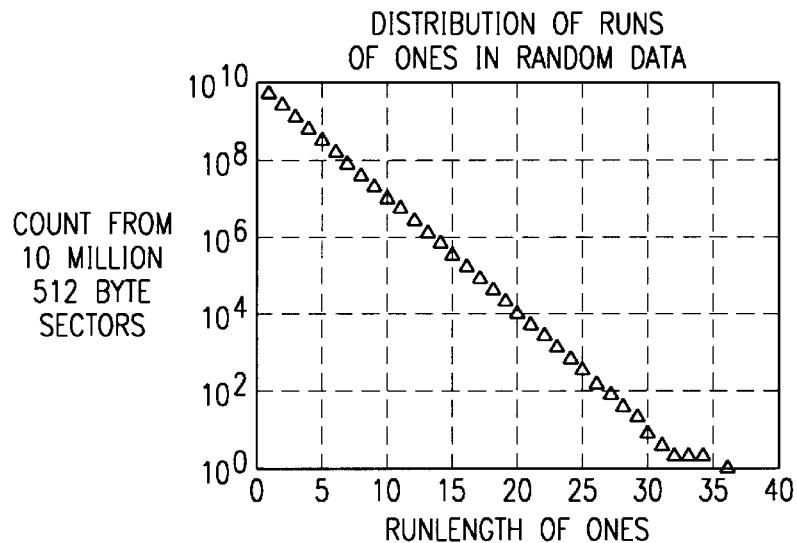
FIG. 1 illustrates a distribution of runs of ones and zeros in random data.
Figure 1B:
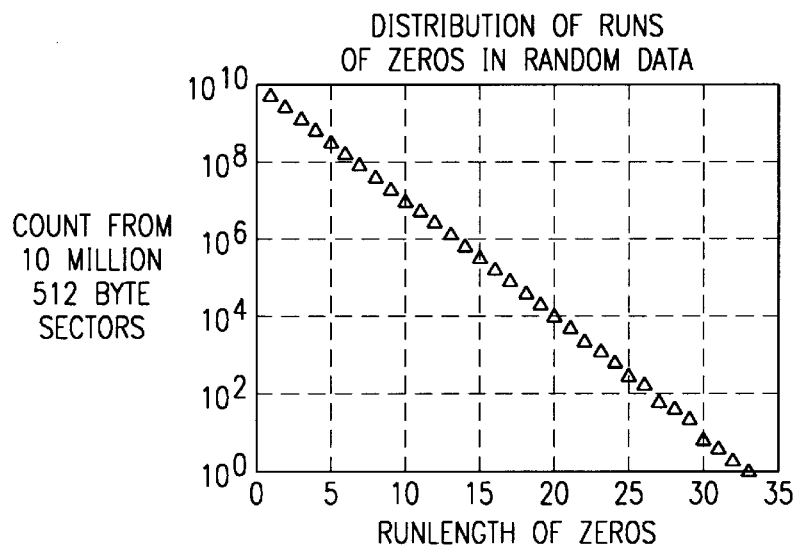

To substantiate the advantages of the present invention, the number of corrections that were needed per sector on an average basis was assessed. Uniformly distributed random user data was generated using a pseudo-random number generator from a C program. The data was then passed through a scrambler polynomial: $1+x^3+x^{10}$. A program was written that searched the data for runs of ones or zeros that exceeded a predetermined runlength. The code determined which bytes and how many bytes were required to be changed optimally to correct the runlength problem. Typically, this meant changing all ones bytes or all zeros bytes to another pattern such as 10101010. Generally, it does not matter what pattern is used as long as it does not create new runlengths that violate the constraints. Runlengths that exceed three bytes in length are often corrected by only changing one byte in the middle. The criterion used for the evaluation was the RLL constraints associated with a common 16/17 rate code. The d constraint is zero, the k constraint is 13, and the k1 constraint is 13. The code searched that data for runs >13 and saved their locations. An additional piece of code determined which bytes to change to correct all runlength violations. The code was set up to run a sector at a time with new random data on each run. Over 10 million sectors worth of data were analyzed in the analysis described. FIG. 1 illustrates the distribution of runs of ones and zeros found in random data. From FIG. 1, the longest run of ones was found in 10 million sectors (with 512 byte sectors) was 36. The longest run of zeros was 33. The algorithm which determines the bytes which are required to be corrected maintains a count of how many bytes were corrected at each sector. Out of the 10 million sectors ran, the maximum number of bytes needing correction in any one sector was 6. The average number of bytes requiring change per sector was 0.25 bytes per sector. This average number was obtained by dividing the total number of bytes that were required to be changed by the total number of sectors processed. This average value provides an indication of the overall efficiency of the system. If a 9 bit locator word and an 8 bit seed was assumed, then the average overhead per sector is 8 bits+0.25*9. This translates to an overall efficiency of 99.7%. Assuming a 10-bit seed and a 14-bit locator word, and assuming that the average correction is 1 byte per sector, then the average efficiency is 99.4%. The calculation for efficiency is efficiency=(number of data bits in a sector/ number of data bits in sector plus overhead) * 100%. Thus, the 99.4% comes from (4096/(4096+10+14))*100. This assumes that 512 byte sector or 4096 bits/sector.

For most sectors there will be no need to write any locator words. When this happens, a special type of sync mark could be used to notify the controller that no changes to the data are required. When changes are required, the sync mark could include information on how many locator words follow the sync mark. This information could be used to partition the data from the locator words. The sync mark could include information with respect to the type of corrections the locators bytes need to be. For example, there could be fields within the sync mark indicating the number and type of locator words that were written. There are two types of corrections: one for an all 1's pattern, one for an all 0's pattern.

A controller with present invention may require a buffer to store large amounts of data and process it with the necessary algorithms in the DSP, firmware, or hardware to locate the RLL violation and construct the locator words. The controller may also require changing the data that is read back from the disk using the locator word information.

Depending on the application and the RLL constraints, the buffer size could vary between 4 bytes to the size of the data sector. An advantage of buffering the entire sector allows determination of the total number of locator words required before writing it to disk. Although it is common to buffer the entire sector, such buffering is not a requirement of the present invention.

Although unlikely, the user data pattern may exactly match the pseudo-random polynomial sequence and seed value. This can be accounted for using the scheme shown in FIG. 6. Next, it is possible for the user data pattern to match only a large portion of the pseudo-random polynomial sequence and seed value. The problem is that the number of locator words may exceed the space allocated for the locator words in the sector. One solution is to allow the data sector be split into two sectors. Some of the locator words and data could be written into one sector while the rest could be written in the next sector. The controller would have to maintain the location of these two sectors.

Another solution would be only to write data that does not violate the RLL constraints. So rather than changing all the zeros byte to 10101010, we could simply not write that byte to the disk. The locator word could indicate to the controller where the offending byte is and which type it is. This scheme is efficient but requires additional effort from the controller and also impacts the implementation of the ECC. The implementation of FIG. 6 would eliminate these situations. The longer the run length is permitted to be, the more efficient the high-efficiency coding scheme becomes. A system that could use longer run length could drastically reduce the possibility of worst case patterns, increasing the efficiency of the system.

Figure 8:
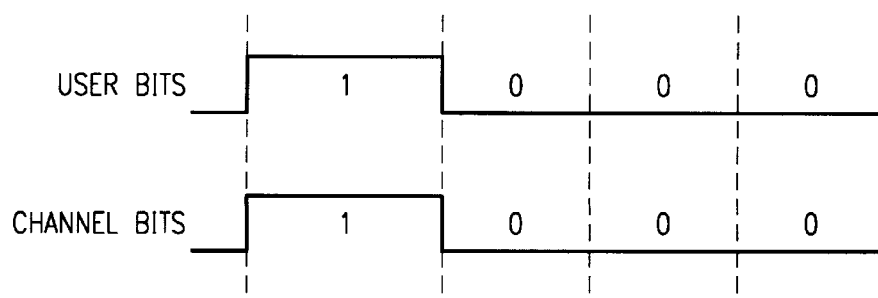
FIG. 8 illustrates a bit pattern of the present invention.

FIG. 8 illustrates user bits and channel bits that are written in accordance with the present invention. The time duration of the user bits is equal to the time duration of the channel bits. The cell size remains unchanged. Normally, the actual channel bits are coded. Only if there is a long run length of either 0 or 1 are bits changed, but again the size of each cell does not change.

What is claimed is:

1. An encoding method to translate user information into encoded information, comprising the steps of:
   receiving said user information; and
   translating said user information into encoded information by enforcing a Run Length Limited encoding scheme,
   wherein said user information and said encoded information have the same cell size.

2. An encoding method to translate user information into encoded information, as in claim 1, wherein said user information is a user bit.

3. An encoding method to translate user information into encoded information, as in claim 1, wherein said encoded information is an encoded bit.

4. An encoding method to translate user information into encoded information, as in claim 1, wherein said encoded information is encoded by an exclusive OR operation.

5. An encoding method to translate user information into encoded information, as in claim 1, wherein said encoded information is encoded by using a polynomial operation.

6. An encoding method to translate user information into encoded information, as in claim 1, wherein said encoded information is encoded by using locator information.

7. An encoding method to translate user information into encoded information, as in claim 1, wherein said encoded information is encoded by a seed.

8. An encoding apparatus to translate user information into encoded information, comprising:
   a circuit for receiving said user information; and
   a circuit for translating said user information into encoded information by enforcing a Run Length Limited encoding scheme,
   wherein said user information and said encoded information have the same cell size.

9. An encoding apparatus to translate user information into encoded information, as in claim 8, wherein said user information is a user bit.

10. An encoding apparatus to translate user information into encoded information, as in claim 8, wherein said encoded information is an encoded bit.

11. An encoding apparatus to translate user information into encoded information, as in claim 8, wherein said encoded information is encoded by an exclusive OR operation.

12. An encoding apparatus to translate user information into encoded information, as in claim 8, wherein said encoded information is encoded by using a polynomial operation.

13. An encoding apparatus to translate user information into encoded information, as in claim 8, wherein said encoded information is encoded by using locator information.

14. An encoding apparatus to translate user information into encoded information, as in claim 8, wherein said encoded information is encoded by a seed.

* * * * *